(12) United States Patent
Wang et al.

(10) Patent No.: US 8,199,569 B2
(45) Date of Patent: *Jun. 12, 2012

(54) DIODE ASSISTED SWITCHING SPIN-TRANSFER TORQUE MEMORY UNIT

(75) Inventors: Xuguang Wang, Eden Prairie, MN (US); Yiran Chen, Eden Prairie, MN (US); Dimitar V. Dimitrov, Edina, MN (US); Hongyue Liu, Maple Grove, MN (US); Xiaobin Wang, Chanhassen, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/087,517

(22) Filed: Apr. 15, 2011

(65) Prior Publication Data

US 2011/0194334 A1 Aug. 11, 2011

Related U.S. Application Data

(63) Continuation of application No. 12/861,932, filed on Aug. 24, 2010, now Pat. No. 7,944,742, which is a continuation of application No. 12/175,724, filed on Jul. 18, 2008, now Pat. No. 7,804,709.

(51) Int. Cl.
*G11C 11/14* (2006.01)
(52) U.S. Cl. ......... 365/171; 365/173; 365/158; 365/175
(58) Field of Classification Search .................. 365/171, 365/173, 158, 175, 72
See application file for complete search history.

(56) References Cited

U.S. PATENT DOCUMENTS

| | | | |
|---|---|---|---|
| 5,461,526 | A | 10/1995 | Hamakawa |
| 5,841,692 | A | 11/1998 | Gallagher |
| 5,963,472 | A | 10/1999 | Inada |
| 6,166,948 | A | 12/2000 | Parkin |
| 6,183,859 | B1 | 2/2001 | Chen |
| 6,522,573 | B2 | 2/2003 | Saito |
| 6,597,618 | B2 | 7/2003 | Zheng |

(Continued)

FOREIGN PATENT DOCUMENTS

WO WO 2008/154519 12/2008

OTHER PUBLICATIONS

Berger, L., Emission of Spin waves by a magnetic multilayer traversed by a current, Physical Review B, Oct. 1, 1996, pp. 9353-9358, vol. 54, No. 13, The American Physical Society, USA.

(Continued)

*Primary Examiner* — David Lam
(74) *Attorney, Agent, or Firm* — Mueting Raasch & Gebhardt PA

(57) ABSTRACT

A memory array includes a cross-point array of bit and source lines. A memory is disposed at cross-points of the cross-point array. The memory unit includes a magnetic tunnel junction data cell electrically coupled to a bit line and a source line. The magnetic tunnel junction data cell is configured to switch between a high resistance state and a low resistance state by passing a polarized write current through the magnetic tunnel junction data cell. A transistor is electrically between the magnetic tunnel junction data cell and the bit line or source line and a diode is in thermal or electrical contact with the magnetic tunnel junction data cell to assist in resistance state switching.

20 Claims, 8 Drawing Sheets

U.S. PATENT DOCUMENTS

| | | |
|---|---|---|
| 6,605,772 B2 | 8/2003 | Harman |
| 6,633,498 B1 | 10/2003 | Engel |
| 6,714,444 B2 | 3/2004 | Huai |
| 6,771,534 B2 | 8/2004 | Stipe |
| 6,781,874 B2 | 8/2004 | Hidaka |
| 6,819,586 B1 | 11/2004 | Anthony |
| 6,829,161 B2 | 12/2004 | Huai |
| 6,838,740 B2 | 1/2005 | Huai |
| 6,845,038 B1 | 1/2005 | Shukh |
| 6,847,547 B2 | 1/2005 | Albert |
| 6,888,742 B1 | 5/2005 | Nguyen |
| 6,933,155 B2 | 8/2005 | Albert |
| 6,950,335 B2 | 9/2005 | Dieny |
| 6,958,927 B1 | 10/2005 | Nguyen |
| 6,963,098 B2 | 11/2005 | Daughton |
| 6,967,863 B2 | 11/2005 | Huai |
| 6,980,469 B2 | 12/2005 | Kent |
| 6,985,385 B2 | 1/2006 | Nguyen |
| 6,992,359 B2 | 1/2006 | Nguyen |
| 7,006,336 B2 | 2/2006 | Coffey |
| 7,031,178 B2 | 4/2006 | Parkin |
| 7,057,921 B2 | 6/2006 | Valet |
| 7,088,609 B2 | 8/2006 | Valet |
| 7,098,494 B2 | 8/2006 | Pakala |
| 7,110,287 B2 | 9/2006 | Huai |
| 7,126,202 B2 | 10/2006 | Huai |
| 7,161,829 B2 | 1/2007 | Huai |
| 7,170,778 B2 | 1/2007 | Kent |
| 7,180,113 B2 | 2/2007 | Braun |
| 7,180,770 B2 | 2/2007 | Perner |
| 7,187,577 B1 | 3/2007 | Wang |
| 7,190,611 B2 | 3/2007 | Nguyen |
| 7,224,601 B2 | 5/2007 | Panchula |
| 7,227,773 B1 | 6/2007 | Nguyen |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,242,045 B2 | 7/2007 | Nguyen |
| 7,242,048 B2 | 7/2007 | Huai |
| 7,245,462 B2 | 7/2007 | Huai |
| 7,252,852 B1 | 8/2007 | Parkin |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,286,395 B2 | 10/2007 | Chen |
| 7,289,356 B2 | 10/2007 | Diao |
| 7,307,876 B2 | 12/2007 | Kent |
| 7,310,265 B2 | 12/2007 | Zheng |
| 7,339,817 B2 | 3/2008 | Nickel |
| 7,342,169 B2 | 3/2008 | Venkatasubramanian |
| 7,345,911 B2 | 3/2008 | Min |
| 7,345,912 B2 | 3/2008 | Luo |
| 7,349,243 B2 | 3/2008 | Lin |
| 7,369,427 B2 | 5/2008 | Diao |
| 7,372,116 B2 | 5/2008 | Fullerton |
| 7,379,327 B2 | 5/2008 | Chen |
| 7,411,817 B2 | 8/2008 | Nozieres |
| 7,430,135 B2 | 9/2008 | Huai |
| 7,453,720 B2 | 11/2008 | Ju |
| 7,479,193 B1 | 1/2009 | Clark |
| 7,486,545 B2 | 2/2009 | Min |
| 7,486,551 B1 | 2/2009 | Li |
| 7,486,552 B2 | 2/2009 | Apalkov |
| 7,489,541 B2 | 2/2009 | Pakala |
| 7,502,249 B1 | 3/2009 | Ding |
| 7,508,702 B2 | 3/2009 | Ho |
| 7,515,457 B2 | 4/2009 | Chen |
| 7,518,835 B2 | 4/2009 | Huai |
| 7,525,862 B1 | 4/2009 | Sun |
| 7,576,956 B2 | 8/2009 | Huai |
| 7,660,151 B2 | 2/2010 | Leuschner |
| 7,800,095 B2 | 9/2010 | An |
| 7,804,709 B2 * | 9/2010 | Wang et al. ............ 365/171 |
| 7,821,818 B2 * | 10/2010 | Dieny et al. ............ 365/158 |
| 2002/0186582 A1 | 12/2002 | Sharma |
| 2004/0084702 A1 | 5/2004 | Jeong |
| 2005/0018475 A1 | 1/2005 | Tran |
| 2005/0104146 A1 | 5/2005 | Nickel |
| 2005/0150535 A1 | 7/2005 | Samavedam |
| 2005/0150537 A1 | 7/2005 | Ghoshal |
| 2006/0215444 A1 | 9/2006 | Perner |
| 2007/0034919 A1 | 2/2007 | Wang |
| 2007/0085068 A1 | 4/2007 | Apalkov |
| 2007/0165449 A1 | 7/2007 | Zheng |
| 2007/0258281 A1 | 11/2007 | Ito |
| 2008/0019040 A1 | 1/2008 | Zhu |
| 2008/0037179 A1 | 2/2008 | Ito |
| 2008/0055792 A1 | 3/2008 | Zheng |
| 2008/0112094 A1 | 5/2008 | Kent |
| 2008/0137224 A1 | 6/2008 | Gao |
| 2008/0154519 A1 | 6/2008 | Zhou |
| 2008/0180827 A1 | 7/2008 | Zhu |
| 2008/0186758 A1 | 8/2008 | Shen |
| 2008/0225584 A1 | 9/2008 | Gao |
| 2008/0273380 A1 | 11/2008 | Diao |
| 2008/0291720 A1 | 11/2008 | Wang |
| 2008/0291721 A1 | 11/2008 | Apalkov |
| 2008/0310213 A1 | 12/2008 | Chen |
| 2008/0310219 A1 | 12/2008 | Chen |
| 2009/0010040 A1 | 1/2009 | Takase |
| 2009/0040855 A1 | 2/2009 | Luo |
| 2009/0050991 A1 | 2/2009 | Nagai |
| 2009/0073750 A1 | 3/2009 | Leuschner |
| 2009/0185410 A1 | 7/2009 | Huai |
| 2009/0302403 A1 | 12/2009 | Nguyen |
| 2010/0034008 A1 | 2/2010 | Wang |

OTHER PUBLICATIONS

Florez, S.H. et al., Modification of Critical Spin Torque Current Induced by rf Excitation, Journal of Applied Physics, 103, 07a708 (2008).

Han et al., Current-Induced Butterfly Shaped Domains and Magnetization Switching in Magnetic Tunnel Junctions, Science and Technology of Advanced Materials 6 (2005) 784-788.

Hosomi et al., A Novel Nonvolatile Memory with Spin Torque Transfer Magnetization Switching: Spin-RAM, 2005 IEEE.

Johnson, M.T., et al., Magnetic anisotropy in metallic multilayers, Rep. Prog. Phys., 1996, pp. 1409-1458, vol. 59,IOP Publishing Ltd., UK.

Kawahara et al., 2Mb Spin-Transfer Torque RAM (SPRAM) with Bit-by-bit Bidirectional Current Write and Parallelizing Direction Current Read, ISSC 2007/Session 26/Non-Volatile Memories/26.5.

Kim, Chris H., et al. Dynamic Vt SRAM: A Leakage Tolerant Cache Memory for Low Voltage Microprocessors, ISLPED '02, Aug. 2002, pp. 251-254, US.

Meng et al., Spin Transfer in Nanomagnetic Devices with Perpendicular Anistropy, Applied Physics Letters 88, 172506 (2006).

Ozatay et al., "Sidewall oxide effects on spin-torque- and magnetic-field-induced reversal characteristics of thin-film nanomagnets", Nature Materials, vol. 7, pp. 567-573 (Jul. 2008).

Prejbeanu et al., "Thermally Assisted MRAM", J. Phys. Condens. Matter 19 (2007) 165218 (23 pp).

Rivkin, K. et al., Magnetization Reversal in the Anisotropy-Dominated Regine Using Time-Dependent Magnetic Fileds, Applied Physics Letters 89, 252507 (2006).

Seki et al., Spin-Polarized Current-Induced Magnetization Reversal in Perpendicularly Magnetized L1o-FePt Layers, Applied Physics Letters 88, 172504 (2006).

Slonczewski et al., Conductance and Exchange Coupling of Two Ferromagnets Separated by a Tunneling Barrier, 1989 the American Physical Society, Physical Review B, vol. 39, No. 10, Apr. 1, 1989.

Slonczewski et al., Current-Driven Excitation of Magnetic Multilayers, Journal of Magnetism and Magnetic Materials 159 (1996) L1-L7.

Sun, Spin-Current Interaction with Monodomain Magnetic Body: A Model Study, Physical Review B, vol. 62, No. 1, Jul. 2000.

Thiele et al., FeRh//FePt Exchange Spring Films for Thermally Assisted Magnetic Recording Media, Applied Physics Letters, vol. 82, No. 17, Apr. 2003, p. 2859-2861.

Thiele et al., "Magnetic and Structural Properties of FePt-FeRh Exchange Spring Films for Thermally Assisted Magnetic Recording Media", IEEE Trans. Magnetics, vol. 40, Jul. 2004, p. 2537-2542.

Thiele et al., Spin Dynamics of the Anitferromagnetic-to-Ferromagnetic Phase Transition in FeRh on a Sub-Picosecind Time Scale, Applied Physics Letters, vol. 85, No. 14, Oct. 2004, p. 2857-2859.

Yagami, Kojiro, et al., Inspection of Intrinsic Critical Currents for Spin-Transfer Magnetization Switching, IEEE Transactions on Magnetics, Oct. 2005, pp. 2615-2617, vol. 41, No. 10.

Zhang, L., et al., Heat-assisted magnetic probe recording on a granular CoNi/Pt multilayered film, Journal of Physics D: Applied Physics, 2006, pp. 2485-2487, vol. 39, IOP Publishing Ltd., UK.

U.S. Appl. No. 12/106,363, filed Apr. 21, 2008, Inventors: Xi et al.
U.S. Appl. No. 12/125,975, filed May 23, 2008, Inventors: Xi et al.
U.S. Appl. No. 12/239,887, filed Sep. 29, 2008, Inventors: Zheng et al.
U.S. Appl. No. 12/242,254, filed Sep. 30, 2008, Inventors: Zheng et al.
U.S. Appl. No. 12/248,237, filed Oct. 9, 2008, Inventor: Zhu.
U.S. Appl. No. 12/389,422, filed Feb. 20, 2009, Inventors: Ahn et al.
U.S. Appl. No. 12/396,868, filed Mar. 3, 2009; Inventors: Zheng.
U.S. Appl. No. 12/425,457, filed Apr. 17, 2009, Inventors: Gao et al.
U.S. Appl. No. 12/425,466, filed Apr. 17, 2009, Inventors: Lou et al.

Zheng, et al., Multilevel Magnetic Resistive Random Access Memory Written at Curie Point, Intermag Europe 2002, BB-02.

Zheng, Y. et al., Magnetic Random Access Memory (MRAM), J. Nano. Sci. Nano Tec. 7, 177-137 (2007).

Zheng et al., Multistate Per-Cell Magnetoresistive Random-Access Memory Written at Curie Point, IEEE Transactions on Magnetics, vol. 38, No. 5, Sep. 2002.

Zhang et al., Heat-Assisted Magnetic Probe Recording on a Granular CoNi/Pt Multilayered Film, Journal of Physics D: Applied Physics, 39, (2006) 2485-2487.

* cited by examiner

DIODE ASSISTED SWITCHING SPIN-TRANSFER TORQUE MEMORY UNIT

RELATED APPLICATION

This application is a continuation of U.S. patent application Ser. No. 12/861,932, filed on Aug. 24, 2010, which is a continuation of U.S. patent application Ser. No. 12/175,724, filed on Jul. 18, 2008 and issued as U.S. Pat. No. 7,804,709 on Sep. 28, 2010. The entire disclosures of the applications are incorporated herein by reference.

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One challenge is that the transistor utilized to provide the write polarized switching current is sized to accommodate the larger switching current and this increase in size limits the scaling of the memory devices. There is a need for a design that aids switching of the STRAM to allow for a smaller transistor, while also maintaining adequate separation between the read current and the switching current distribution.

BRIEF SUMMARY

The present disclosure relates to spin-transfer torque memory. In particular, present disclosure relates to a spin-transfer torque memory that includes a diode to assist in data switching and provide heat to the spin-transfer torque memory. By heating the spin-transfer torque memory, the critical switching current can be reduced, allowing a smaller transistor to be used.

One illustrative memory unit includes a magnetic tunnel junction data cell electrically coupled to a bit line and a source line. The magnetic tunnel junction data cell is configured to switch between a high resistance state and a low resistance state by passing a polarized write current through the magnetic tunnel junction data cell. A transistor is electrically between the magnetic tunnel junction data cell and the bit line or source line and a diode is in thermal or electrical contact with the magnetic tunnel junction data cell to assist in resistance state switching.

An illustrative spin-transfer torque memory unit includes a bit line, a source line, and a magnetic tunnel junction data cell electrically coupled to the bit line and the source line. The magnetic tunnel junction data cell is configured to switch between a high resistance state and a low resistance state by passing a polarized write current through the magnetic tunnel junction data cell. A transistor is electrically between the magnetic tunnel junction data cell and the bit line or source line. A diode is in electrical contact with the magnetic tunnel junction data cell.

An illustrative method for programming a spin-transfer torque memory cell includes switching a magnetic tunnel junction data cell from a low resistance state to a high resistance state by passing a polarized write current through the magnetic tunnel junction data cell. The polarized write current provided by a transistor is electrically coupled to the magnetic tunnel junction data cell and a diode in thermal contact with the magnetic tunnel junction data cell.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
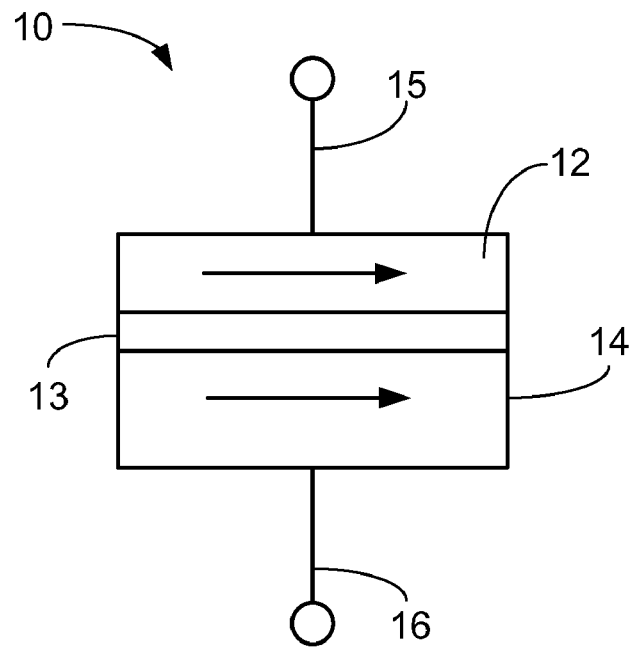
FIG. 1 is a cross-sectional schematic diagram of an illustrative magnetic tunnel junction memory cell in the low resistance state.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to spin-transfer torque memory. In particular, present disclosure relates to a spin-transfer torque memory that includes a diode to assist in data switching and provide heat to the spin-transfer torque memory. By joule heating through the diode current, the switching current needed by a transistor can be reduced and a smaller transistor can be used to save the cell area and increase memory density. The thermal assisted switching may also enable the page or block erase operation to speed up the memory device due to reduced switching current. An asymmetrical current switching stack is also described. By thermally and/or electrically contacting a diode with the memory stack, the local thermal heating effect can reduce the critical switching current and can reduce the current required by the access transistor. Therefore a smaller transistor can be used and the unit cell area can be reduced to increase the memory density. The asymmetrical switching stack is also described to combine with this scheme to help reduce the transistor size. Memory structure is described to implement such diode structures. A flash like block or sector erase is also discussed. While the present disclosure is not so limited, an appreciation of various aspects of the disclosure will be gained through a discussion of the examples provided below.

Figure 2:
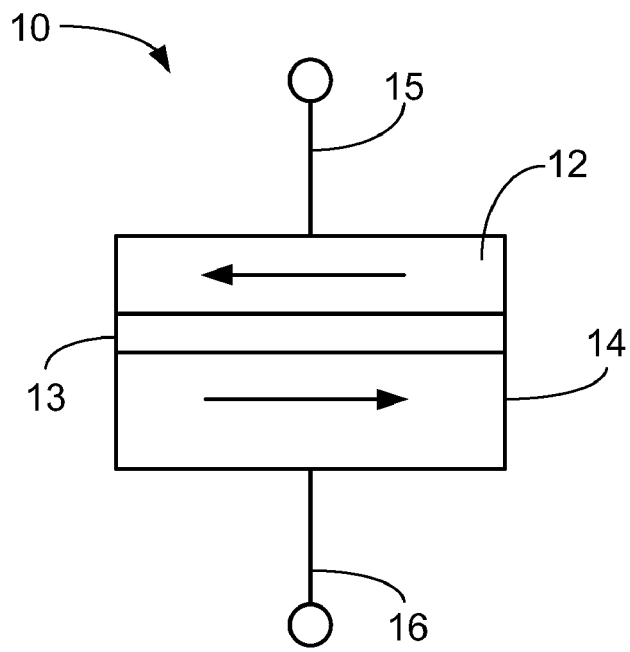
FIG. 2 is a cross-sectional schematic diagram of another magnetic tunnel junction memory cell in the high resistance state.

FIG. 1 is a cross-sectional schematic diagram of an illustrative magnetic tunnel junction data cell 10 in the low resistance state and FIG. 2 is a cross-sectional schematic diagram of another magnetic tunnel junction data cell 10 in the high resistance state. The magnetic tunnel junction data cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the magnetic tunnel junction data cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the magnetic tunnel junction data cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the magnetic tunnel junction data cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the magnetic tunnel junction data cell 10 via spin-transfer occurs when a current, passing through a magnetic layer of the magnetic tunnel junction data cell 10, becomes spin polarized and imparts a spin torque on the free layer 12 of the magnetic tunnel junction data cell 10. When a sufficient spin torque is applied to the free layer 12, the magnetization orientation of the free layer 12 can be switched between two opposite directions and accordingly the magnetic tunnel junction data cell 10 can be switched between the parallel state (i.e., low resistance state or "0" data state) and anti-parallel state (i.e., high resistance state or "1" data state) depending on the direction of the current.

The illustrative spin-transfer torque magnetic tunnel junction data cell 10 may be used to construct a memory device that includes multiple magnetic tunnel junction data cell where a data bit is stored in magnetic tunnel junction data cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque magnetic tunnel junction data cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
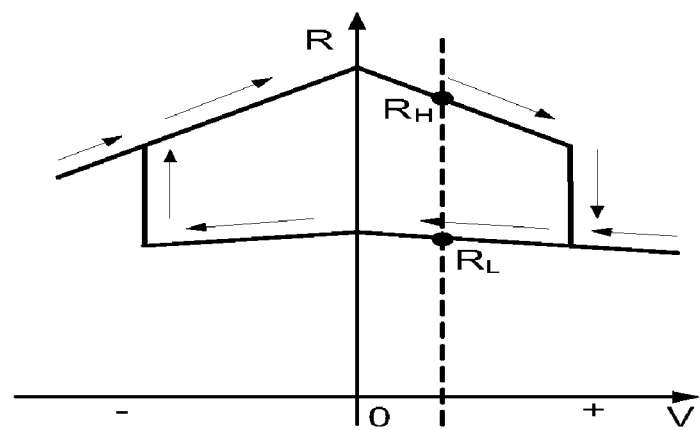
FIG. 3 is a graph of a static R-V (resistance-voltage) curve of a magnetic tunnel junction memory cell.

FIG. 3 is a graph of a static R-V sweep curve of a magnetic tunnel junction data cell. When applying a positive voltage on the second electrode 16 in FIG. 1 or 2, the MTJ 10 enters the positive applied voltage region in FIG. 3 and switches from the high resistance state (FIG. 2) to the low resistance state (FIG. 1). When applying a positive voltage on the first electrode 15 in FIG. 1 or 2, the magnetic tunnel junction data cell 10 enters the negative applied voltage region in FIG. 3. The resistance of the magnetic tunnel junction data cell switches from the low resistance state (FIG. 1) to the high resistance state (FIG. 2).

Let $R_H$ and $R_L$ denote the high and low magnet resistance, respectively. We define the Tunneling Magneto Resistance Ratio (TMR) as TMR=$(R_H-R_L)/R_L$. Here $R_H$, $R_L$ and TMR are determined by also the sensing current or voltage, as shown in FIG. 3. Generally, a large TMR makes it easier to distinguish the two resistance states of the magnetic tunnel junction data cell.

Figure 4:
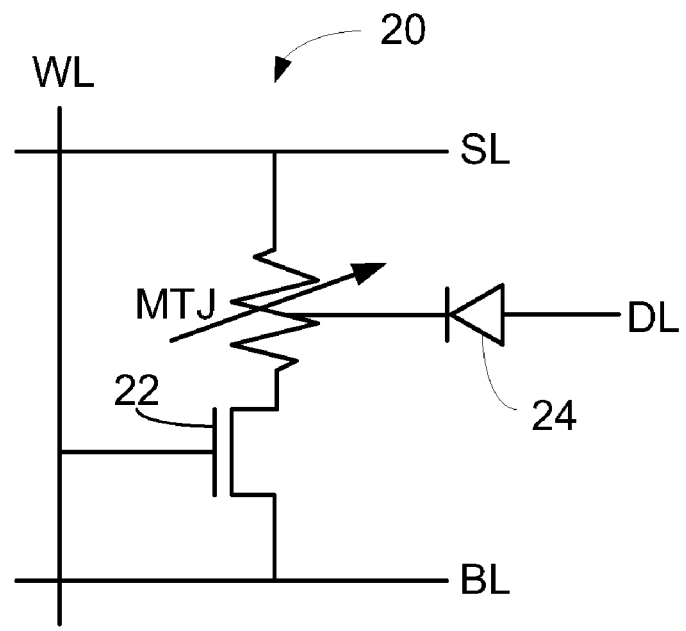
FIG. 4 is a schematic circuit diagram of a memory unit including an assist diode.

FIG. 4 is a schematic circuit diagram of a memory unit 20. The memory unit 20 includes a magnetic tunnel junction data cell MTJ electrically coupled to a bit line BL and a source line SL. The magnetic tunnel junction data cell MTJ is configured to switch between a high resistance state and a low resistance state by passing a polarized write current through the magnetic tunnel junction data cell. A transistor 22 is electrically between the magnetic tunnel junction data cell MTJ and the bit line BL or source line SL. In many embodiments, a diode 24 is in thermal contact with the magnetic tunnel junction data cell MTJ and provides heat to the MTJ. In some embodiments, the diode 24 is in electrical contact with the magnetic tunnel junction data cell MTJ and provides current to the MTJ. In illustrative embodiments, the diode 24 is in electrical contact and thermal contact with the magnetic tunnel junction data cell MTJ and provides both heat and current (forward bias) to the MTJ. The diode 24 can be any useful diode 24 such as, for example, a p-n junction. The diode 24 is in electrical contact with a diode line DL that provides current to the diode 24.

Figure 5:
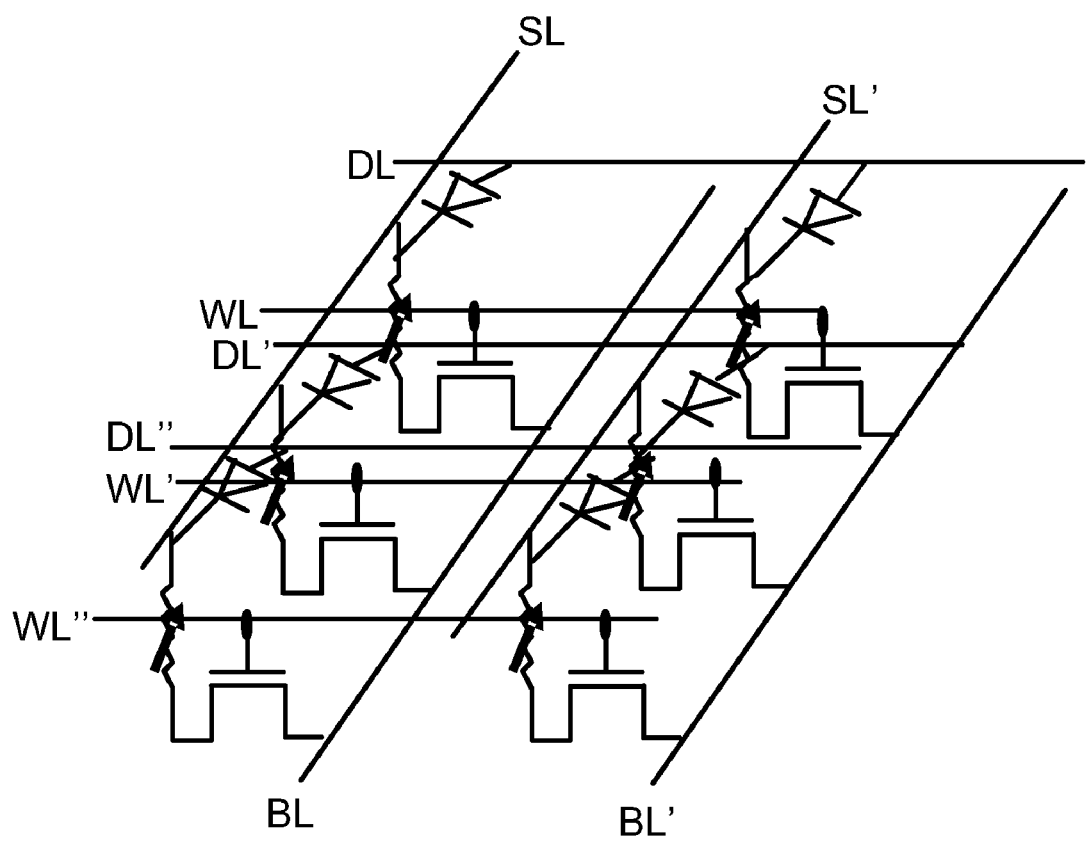
FIG. 5 is a schematic circuit diagram of a memory unit array including an assist diode.

FIG. 5 is a schematic circuit diagram of a memory unit array. The memory unit array includes a plurality of memory units rearranged at cross-points of source lines SL, SL', and bit lines BL, BL' and word lines WL, WL', WL". The corresponding diodes are connected to respective diode lines DL, DL', DL". The memory unit array can include any useful number of memory units.

To switch the magnetic tunnel junction MTJ from the high resistance state to the low resistance state, the source line SL is biased to ground and the diode 24 provides switching current in the same direction as the transistor 22. Thus, current from both the diode 24 and the transistor 22 switches the magnetic tunnel junction MTJ from the high resistance state to the low resistance state. The diode 24 can also heat the magnetic tunnel junction MTJ stack since it can be in thermal contact with the magnetic tunnel junction MTJ stack and this current is localized. As a result, the critical switching current is reduced and the current required from the transistor 22 is also reduced. Therefore a smaller transistor can be used and the area can be saved. Although the diode 24 is in thermal contact with the magnetic tunnel junction MTJ stack, most of the diode current will directly flow through the free layer 12 (see FIGS. 1 and 2), since the diode 24 contacts the magnetic tunnel junction MTJ stack layers in parallel configuration and the insulating barrier 13 (see FIGS. 1 and 2) has a higher resistance than the free layer 12. This assists in confining the heat to be localized to heat mostly the free layer 12.

To switch the magnetic tunnel junction MTJ from the low resistance state to the high resistance state, the bit line BL is biased to ground and the transistor 22 provides switching current having an opposite polarity of the switching current from high to low resistance state. In this mode, the diode 24 is switched off or floating. In many embodiments, the diode 24 is switched on only when the magnetic tunnel junction MTJ is switched from the high resistance state to the low resistance state.

Figure 6:
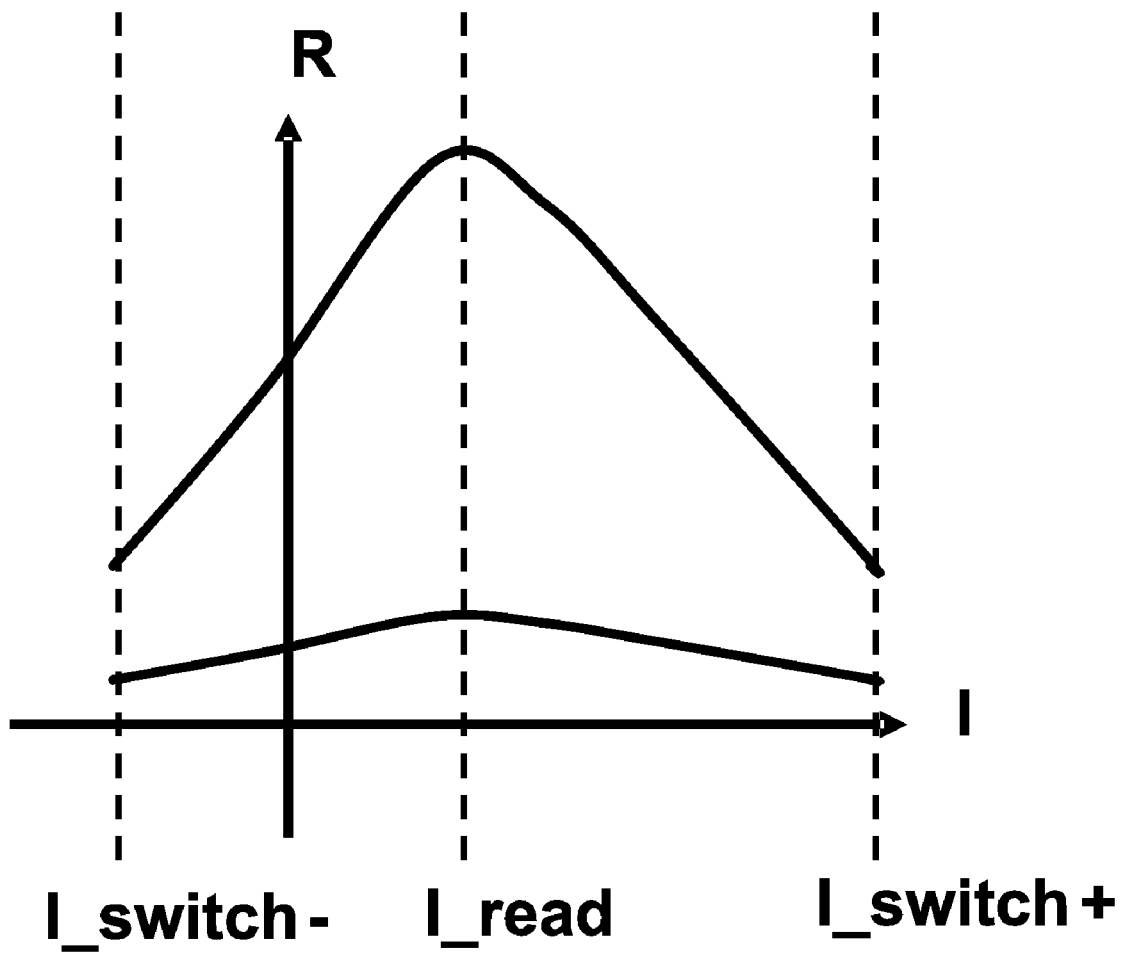
FIG. 6 is a graph of a current verses resistance switching curve for a magnetic tunnel junction memory cell.

FIG. 6 is a graph of a current verses resistance switching curve for a magnetic tunnel junction memory cell. This graph illustrates an asymmetric switching curve. In many embodiments, the magnetic tunnel junctions described herein posses an asymmetric switching curve. In these magnetic tunnel junction stacks, the switching current from high R (resistance) to low R states I_switch+ is purposely increased and is larger (magnitude) than switching current from the low R to high R states I_switch–. Since reading I_read is in the same direction as switching from high R to low R, this can improve the thermal stability of the cell during reading and reduce the read disturb. During circuit operation, the diode doesn't need to be turned on for the low R to high R switching. Because the switching current is low and even without the diode thermal assist a smaller transistor can provide enough current. For the high R to low R state, although the switching current is purposely increased, the diode can be turned on in this mode so that the same transistor can still provide enough current with the help of diode thermal heating.

Magnetic tunnel junction memory cells can have their current switching curves tailored to an asymmetric switching curve as illustrated in FIG. 6 in a number of ways. For example, by altering the thicknesses of the layers that form the Magnetic tunnel junction memory cell.

Figure 7:
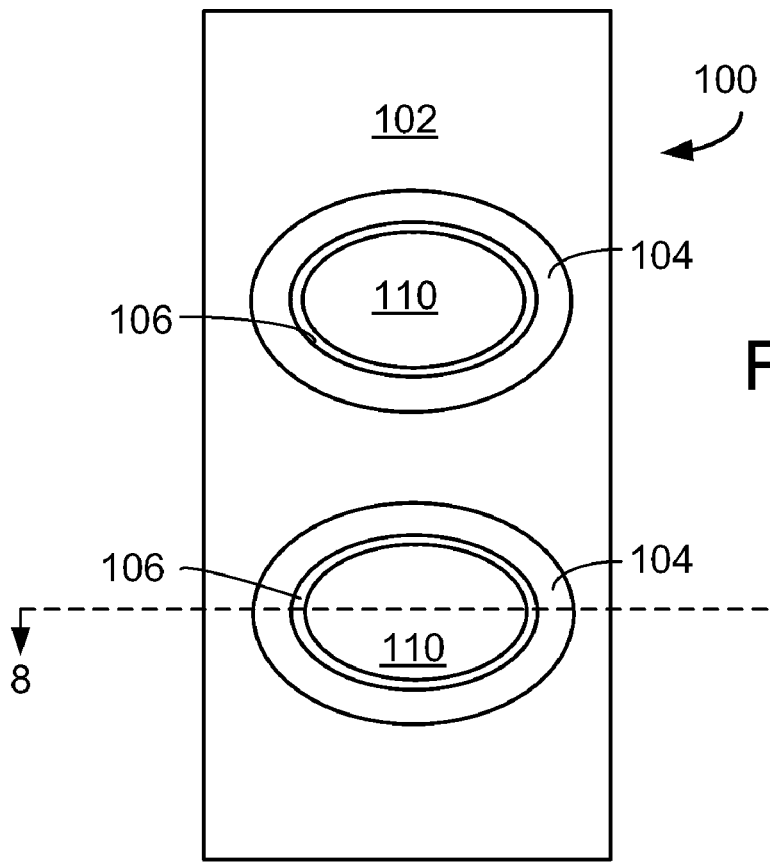
FIG. 7 is a schematic top view of an illustrative memory unit.
Figure 8:
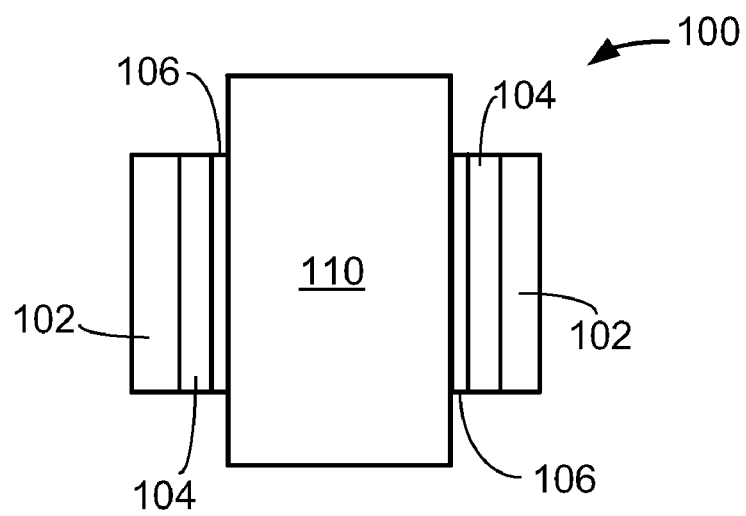
FIG. 8 is a schematic cross-sectional view of the illustrative memory unit of FIG. 7 taken along line 8-8.

FIG. 7 is a schematic top view of an illustrative memory unit 100. FIG. 8 is a schematic cross-sectional view of the illustrative memory unit of FIG. 7 taken along line 8-8. The memory unit 100 includes two magnetic tunnel junction memory cells 110, however any number of magnetic tunnel junction memory cells 110, including one can be utilized. A p-n diode is at least partially disposed about the magnetic tunnel junction memory cell 110. The p-n diode is formed of an n-doped semiconductor material 104 in contact with a p-doped semiconductor material 102. In many embodiments, the n-doped semiconductor material 104 is located closer to the magnetic tunnel junction memory cells 110 than the p-doped semiconductor material 102. In the illustrated embodiment, the p-n diode surrounds a perimeter of the magnetic tunnel junction memory cell 110.

An oxide layer 106 (e.g., $SiO_2$) is disposed at least partially between the magnetic tunnel junction memory cell 110 and the p-n diode. In many embodiments, the oxide layer 106 couples the p-n diode (e.g., the n-doped semiconductor material 104) to the magnetic tunnel junction memory cell 110. This oxide layer 106 allows direct tunneling current to be injected into the magnetic tunnel junction memory cell 110 from the forward biased p-n diode and blocks current flow when the p-n diode is floating or reversed biased.

The illustrated structure can be formed utilizing conventional semiconductor fabrication techniques. For example, the structure can be formed by using a diode first growth process. An epitaxy growth from the bottom substrate through a via is used to form the Si layer. The p-doped and n-doped region are then defined. After that the via is etched back and a thinner layer of $SiO_2$ is form for isolation. The MTJ stack is then grown inside the via. If the MTJ stack has a high aspect ratio, filling in the small via with stack will be challenging.

Figure 9:
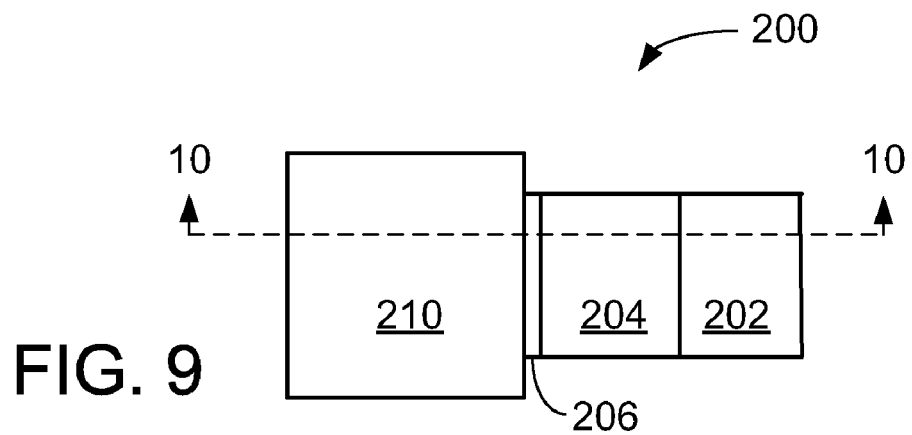
FIG. 9 is a schematic cross-sectional view of another illustrative memory unit.
Figure 10:
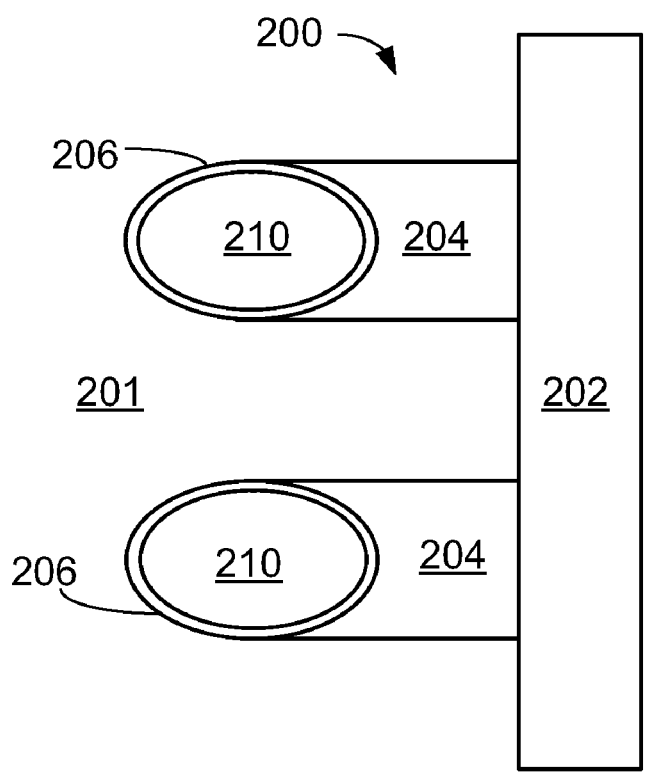
FIG. 10 is a schematic top view of the illustrative memory unit of FIG. 9 taken along line 10-10.

One way to get around this is to use only one sided p-n diode as shown in FIGS. 9 and 10. By doing this, more space will be left for MTJ stack formation though the heating efficiency will be decreased due to less contact area. FIG. 9 is a schematic cross-sectional view of another illustrative memory unit. FIG. 10 is a schematic top view of the illustrative memory unit of FIG. 9 taken along line 10-10. The memory unit 200 includes two magnetic tunnel junction memory cells 210, however any number of magnetic tunnel junction memory cells 210, including one can be utilized. A p-n diode is at least partially disposed about the magnetic tunnel junction memory cell 210. The p-n diode is formed of an n-doped semiconductor material 204 in contact with a p-doped semiconductor material 202. In many embodiments, the n-doped semiconductor material 204 is located closer to the magnetic tunnel junction memory cells 210 than the p-doped semiconductor material 202. In the illustrated embodiment, the p-n diode only a portion of a perimeter of the magnetic tunnel junction memory cell 210.

An oxide layer 206 (e.g., SiO$_2$) is disposed at least partially between the magnetic tunnel junction memory cell 210. In many embodiments, the oxide layer 206 couples the p-n diode (e.g., the n-doped semiconductor material 204) to the magnetic tunnel junction memory cell 210. This oxide layer 206 allows direct tunneling current to be injected into the magnetic tunnel junction memory cell 210 from the forward biased p-n diode and blocks current flow when the p-n diode is floating or reversed biased. This structure can be embedded within a semiconductor substrate 201 and formed utilizing the techniques described above.

Figure 11:
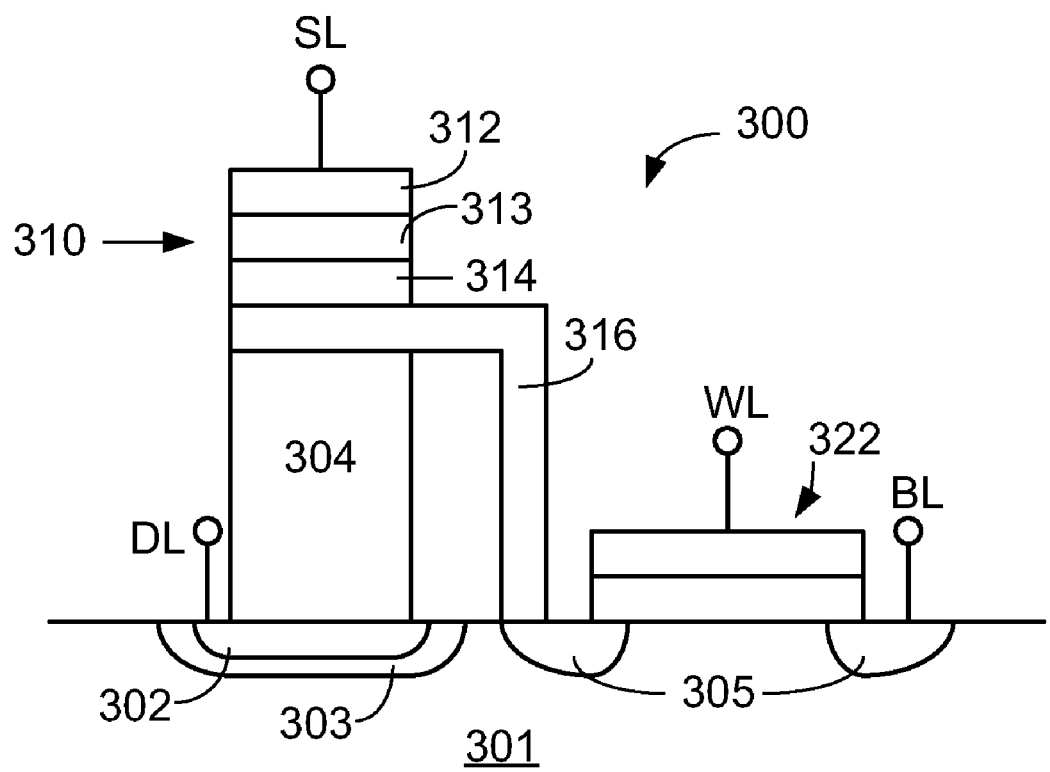
FIG. 11 is a schematic side view of another illustrative memory unit.

FIG. 11 is a schematic side view of another illustrative memory unit 300. The memory unit 300 includes a magnetic tunnel junction memory cell 310, however any number of magnetic tunnel junction memory cell 310, can be utilized. Illustrative layers of the magnetic tunnel junction memory cell 310 include a ferromagnetic free layer 312 and a ferromagnetic reference (i.e., pinned) layer 314. The ferromagnetic free layer 312 and a ferromagnetic reference layer 314 are separated by an oxide barrier layer 313 or tunnel barrier. This basic structure is present in the prior figures even if there are not explicitly shown. The magnetic tunnel junction memory cell 310 includes a source line SL contact and a bit line contact BL that are electrically connected to the magnetic tunnel junction memory cell 310. The bit line contact BL is electrically connected to the magnetic tunnel junction memory cell 310 via a transistor 322 and an electrically conducting element 316. Transistor doped regions 305 are defined in the substrate 301 to direct current.

The electrically conducting element 316 at least partially separates the magnetic tunnel junction memory cell 310 from a p-n diode. The p-n diode is formed of an n-doped semiconductor material 304 in contact with a p-doped semiconductor material 302. In many embodiments, the n-doped semiconductor material 304 is located closer to the magnetic tunnel junction memory cells 310 than the p-doped semiconductor material 302. In the illustrated embodiment, the p-n diode is stacked between the magnetic tunnel junction memory cell 310 and a substrate 301. The diode includes a diode contact DL for electrical connection. A well 303 is defined in the substrate 301 to isolate the p-n diode from the substrate 301 and it is biased the same as 302 to avoid leakage through it. The transistor 322 includes a word line electrical contact WL for activation of the transistor 322.

One illustrative advantage of the thermal assisting methods described above is that a block or page erase can be implemented to improve the memory speed of a memory device. If the memory device needs to be reset, the whole diode line can be selected and all cells on the same line can be erased from high R to low R states at the same time with a higher current. Such operation mode is similar to current flash memory operation and is beneficial for large volume memory parts debugging or resetting.

Figure 12:
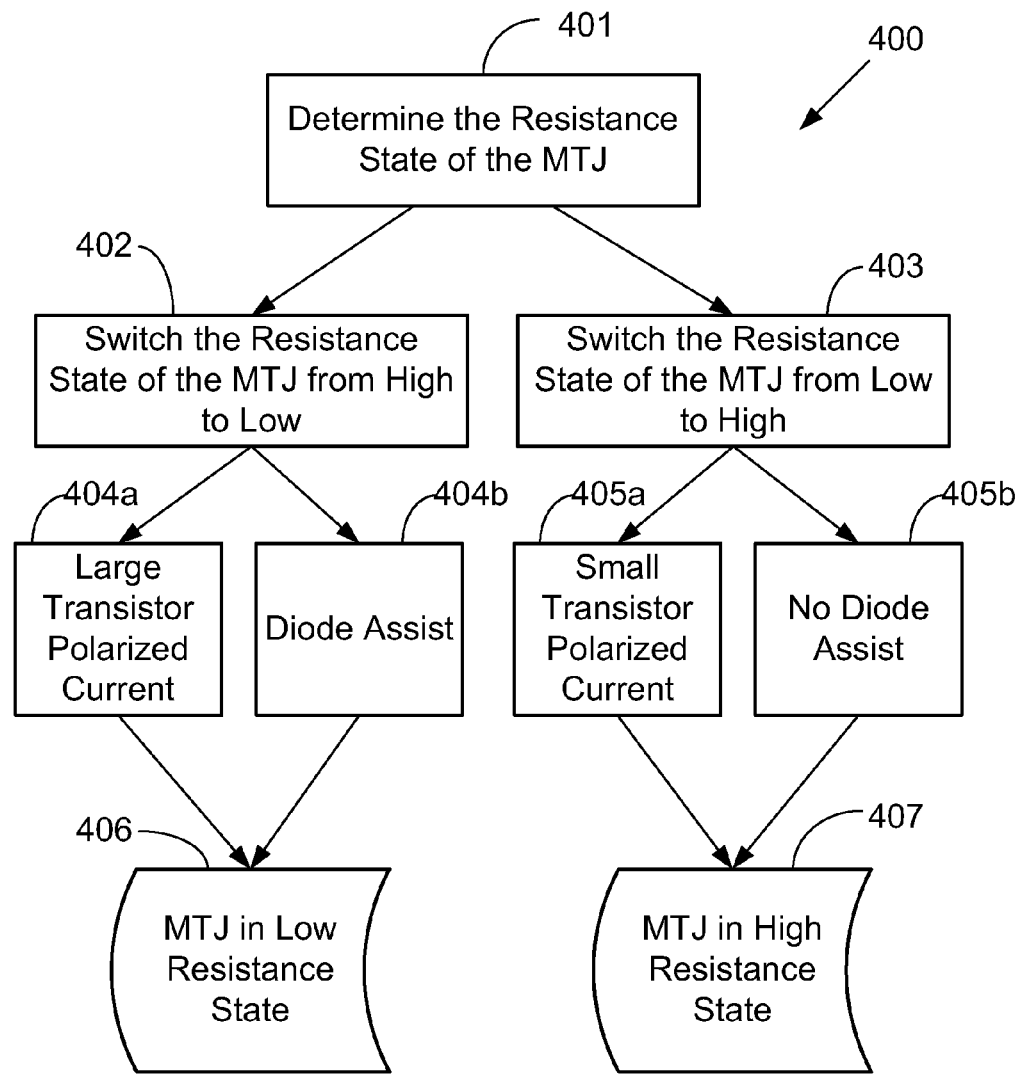
FIG. 12 is a flow diagram of an illustrative method for switching a resistance state of an illustrative magnetic tunnel junction memory cell.

FIG. 12 is a flow diagram of an illustrative method 400 for switching a resistance state of an illustrative magnetic tunnel junction memory cell. The method 400 includes a step 401 of determining a resistance state of the magnetic tunnel junction memory cell. Step 402 switches the resistance state from a high resistance state to a low resistance state by passing a first or large polarized write current through the magnetic tunnel junction data cell, where at least a portion of the first polarized write current is provided by a transistor at step 404*a* and assisting the high resistance state to a low resistance state switch by passing a current through a diode in thermal contact with the magnetic tunnel junction data cell at step 404*b*. The magnetic tunnel junction memory cell is then in a low resistance state at block 406.

Step 403 switches the resistance state from a low resistance state to a high resistance state by passing a second or small polarized write current through the magnetic tunnel junction data cell, where all of the first polarized write current is provided by a transistor at step 405*a* and the diode does not assist in the low resistance state to high resistance state switch at step 405*b*. The magnetic tunnel junction memory cell is then in a low resistance state at block 407.

Thus, embodiments of the DIODE ASSISTED SWITCHING SPIN-TRANSFER TORQUE MEMORY UNIT are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:
1. A spin transfer torque memory unit comprising:
    a magnetic tunnel junction data cell configured to switch between a high resistance state and a low resistance state by passing a polarized write current through the magnetic tunnel junction data cell;
    a transistor electrically coupled to the magnetic tunnel junction data cell; and
    a diode in thermal contact with the magnetic tunnel junction data cell.
2. A spin transfer torque memory unit according to claim 1, wherein the diode provides heat and current to the magnetic tunnel junction data cell.
3. A spin transfer torque memory unit according to claim 2, wherein the diode provides heat and current to the magnetic tunnel junction data cell to switch the magnetic tunnel junction data cell from a high resistance state to a low resistance state.
4. A spin transfer torque memory unit according to claim 3, wherein the transistor provides current to the magnetic tunnel junction data cell to switch the magnetic tunnel junction data cell from a high resistance state to a low resistance state.
5. A spin transfer torque memory unit according to claim 1, wherein the magnetic tunnel junction data cell is configured to operate according to an asymmetric switching curve.

6. A spin transfer torque memory unit according to claim 1, wherein an oxide layer couples the diode to the magnetic tunnel junction data cell.

7. A spin transfer torque memory unit according to claim 6, wherein the diode does not completely surround a perimeter of the magnetic tunnel junction data cell.

8. A spin transfer torque memory unit according to claim 1, wherein an electrically conducting layer electrically couples the diode to the magnetic tunnel junction data cell and also electrically couples the magnetic tunnel junction data cell to the transistor.

9. A spin transfer torque memory unit according to claim 1, wherein the diode is a p-n diode and the n-doped material is closer to the magnetic tunnel junction data cell than the p-doped material.

10. A spin transfer torque memory unit comprising:
- a magnetic tunnel junction data cell configured to switch between a high resistance state and a low resistance state by passing a polarized write current through the magnetic tunnel junction data cell;
- a transistor electrically coupled to the magnetic tunnel junction data cell; and
- a p-n diode in thermal contact with the magnetic tunnel junction data cell, the p-n diode surrounds a perimeter of the magnetic tunnel junction data cell.

11. A spin transfer torque memory unit according to claim 10, wherein the p-n diode provides heat and current to the magnetic tunnel junction data cell and the p-n diode n-doped material is closer to the magnetic tunnel junction data cell than the p-n diode p-doped material.

12. A spin transfer torque memory unit according to claim 10, wherein the p-n diode provides heat and current to the magnetic tunnel junction data cell to switch the magnetic tunnel junction data cell from a high resistance state to a low resistance state.

13. A spin transfer torque memory unit according to claim 10, wherein the transistor provides current to the magnetic tunnel junction data cell to switch the magnetic tunnel junction data cell from a high resistance state to a low resistance state.

14. A spin transfer memory unit according to claim 10, wherein the magnetic tunnel junction data cell is configured to operate according to an asymmetric switching curve.

15. A spin transfer memory unit according to claim 10, wherein an oxide layer couples the p-n diode to the magnetic tunnel junction data cell.

16. A spin transfer memory unit according to claim 15, wherein the p-n diode completely surrounds a perimeter of the magnetic tunnel junction data cell.

17. A spin transfer memory unit according to claim 15, wherein the magnetic tunnel junction data cell is stacked on the p-n diode.

18. A spin transfer torque memory unit according to claim 10, wherein the p-n diode provides heat and current to the magnetic tunnel junction data cell and the p-n diode n-doped material is closer to the magnetic tunnel junction data cell than the p-n diode p-doped material.

19. A spin transfer torque memory unit according to claim 10, wherein the p-n diode is at least partially disposed in a semiconductor substrate.

20. A spin transfer torque memory unit comprising:
- a magnetic tunnel junction data cell configured to switch between a high resistance state and a low resistance state by passing a polarized write current through the magnetic tunnel junction data cell;
- a transistor electrically coupled to the magnetic tunnel junction data cell with an electrically conducting element; and
- a p-n diode in thermal contact with the magnetic tunnel junction data cell, the p-n diode is separated from the magnetic tunnel junction data cell by the electrically conducting element.

* * * * *